(12) United States Patent  
Fujii et al.

(10) Patent No.: US 8,313,971 B2
(45) Date of Patent: Nov. 20, 2012

(54) CAMERA MODULE MANUFACTURING METHOD AND CAMERA MODULE

(75) Inventors: Yuiti Fujii, Hino (JP); Shigeru Hosoe, Hachioji (JP); Takemi Miyazaki, Hamura (JP)

(73) Assignee: Konica Minolta Opto, Inc., Tokyo (JP)

( * ) Notice: Subject to any disclaimer, the term of this patent is extended or adjusted under 35 U.S.C. 154(b) by 608 days.

(21) Appl. No.: 12/524,694

(22) PCT Filed: Jan. 9, 2008

(86) PCT No.: PCT/JP2008/050124
§ 371 (c)(1),
(2), (4) Date: Jul. 27, 2009

(87) PCT Pub. No.: WO2008/093516
PCT Pub. Date: Aug. 7, 2008

(65) Prior Publication Data
US 2010/0118182 A1    May 13, 2010

(30) Foreign Application Priority Data
Jan. 30, 2007  (JP) ................................. 2007-019369

(51) Int. Cl.
*H01L 51/40* (2006.01)
(52) U.S. Cl. .......... 438/57; 438/110; 257/432; 257/435; 257/E31.127

(58) Field of Classification Search ................ 438/57, 438/110; 257/435, E31.127, 432
See application file for complete search history.

(56) References Cited

U.S. PATENT DOCUMENTS

| 5,444,520 A | 8/1995 | Murano |
| 2006/0169878 A1* | 8/2006 | Kasano et al. ............. 250/226 |

FOREIGN PATENT DOCUMENTS

| JP | 2004-229167 |   | 8/2004 |
| JP | 2004229167 A | * | 8/2004 |
| JP | 2007123909 A | * | 5/2007 |
| WO | WO 2005/041561 A1 |   | 5/2005 |
| WO | WO 2006/073085 A1 |   | 7/2006 |

OTHER PUBLICATIONS

European Search Report dated Jul. 23, 2010.

* cited by examiner

*Primary Examiner* — Robert Huber
*Assistant Examiner* — Matthew Gordon
(74) *Attorney, Agent, or Firm* — Finnegan, Henderson, Farabow, Garrett & Dunner, L.L.P.

(57) ABSTRACT

It is possible to provide a camera module manufacturing method and a camera model which can improve performance of a camera module without complicating the manufacturing method. A light shield is formed on the side surface of each lens body (11) and a lens support member (12). Thus it is possible to obtain the diaphragm function for regulating the incident light flux transmission area and the function for suppressing the intrusion of stray light without using a separate diaphragm or a light shielding member.

12 Claims, 3 Drawing Sheets

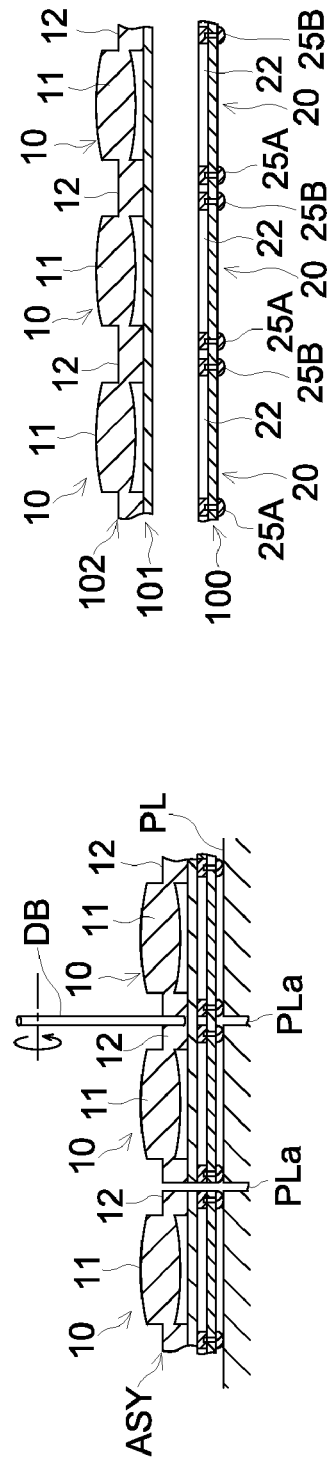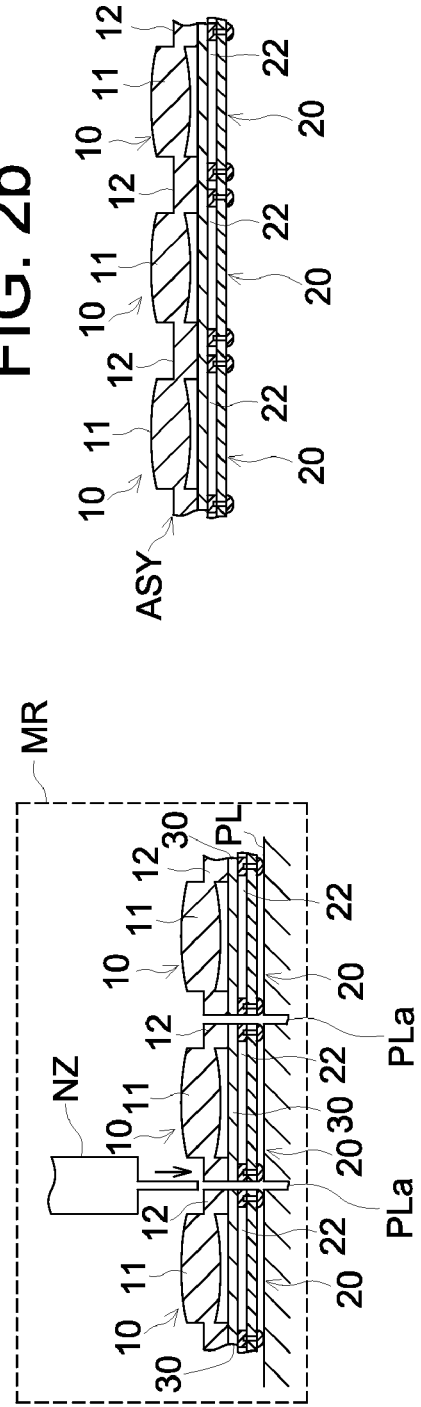

CAMERA MODULE MANUFACTURING METHOD AND CAMERA MODULE

TECHNICAL FIELD

The present invention relates to a camera model manufacturing method and in particular to a manufacturing method of a miniature camera module and a miniature camera module suitable to be mounded on a mobile phone.

PRIOR ART

In recent years, development of miniature cameras mounted on handy personal computers (mobile personal computers) and mobile phones has been promoted. For example, a mobile phone provided with the miniature camera captures an image of a calling party by the miniature camera as image data and can transmit to the intended party. Such miniature camera is generally configured with an image sensor and a lens. Namely, an optical image is formed by the lens on the image sensor and the image sensor creates an electric signal corresponding to the optical image.

Meanwhile, further downsizing has been required to the mobile phones and the handy personal computers, and downsizing has been requested also for the miniature camera used therein. To satisfy the demands of downsizing for the miniature cameras, a camera model where the lens and the image sensor are integrated has been developed.

According to the conventional manufacturing method of the camera module, the camera module as the miniature camera is often manufactured through successive processes i.e. molding process→LF etching process→PKG dicing process→PKG mounting process→sensor chip mounting process→washing process→lens mounting process→testing process.

The manufacturing process will be described more specifically. First, at the molding process, there is formed a mold forming body to be a main body of the camera module by molding a semiconductor chip on a substrate (so-called lead frame LF) on which the semiconductor chip is mounted. At that time, to enhance manufacturing efficiency, usually a plurality of mold forming bodies are formed integrally. In the LF etching process, the lead frame is removed by etching leaving a portion to serve as an external terminal. Whereby, a protruding terminal is formed at a bottom surface of the mold forming body. Thereafter, in packaging (PKG) dicing process, the plurality of the mold forming bodies formed being connected each other are separated into individual pieces. Next, in the PKG mounting process, the mold forming bodies divided into pieces are mounted on a flexible substrate, and in the sensor chip mounting process, the sensor chip is mounded on each mold forming body. Thereafter the mold forming bodies on which the sensor chip has been mounted is subject to washing, and in the lens mounting process, the lens section is mounted on the mold forming body. At last, the camera module is tested to complete camera module manufacturing.

As above, according to the conventional camera module manufacturing method, PKG dicing is performed right after the LF etching so that the mold forming bodies are separated in pieces. Thus in processes from the sensor chip mounting process to the lens mounting process, the individual mold forming bodies in pieces (PKG units) are mounted on the flexible substrate. Namely, the processes of mounting the sensor chips and the lens holder are carried out in a state where each of the individual mold forming bodies in pieces are mounted and fixed on the flexible substrate, in other wards integrated with the flexible substrate. Therefore, the mounting process of the sensor chip and the lens holder is carried out individually for each mold forming body in pieces. Thus since it is not possible to mount the sensor chips and lens holders on the plurality of the mold forming bodies collectively, there was a problem that the manufacturing process was ineffective.

To cope with the above problem, the Patent Document 1: 2004-229167 discloses a manufacturing method of the camera module in the following processes. First, there are prepared an image sensor wafer configured by providing the plurality of the image sensor chips and a lens array in a shape of the wafer formed by providing a plurality of the lenses having substantially the same size as the image sensor chip. Thereafter the lens array is bonded to a surface of the image sensor wafer. Further, by cutting the image sensor chip and the lens array along a cutting groove, the camera modules are separated in pieces. Whereby, the manufacturing method can be simplified.

Patent Document 1: Unexamined Japanese patent application publication No. 2004-229167

DISCLOSURE OF THE INVENTION

Problem to be Resolved

Meanwhile, the material of the lens array used in manufacturing the camera module is optically transparent in general, and when the lens having been cut is used in a camera module, stray light not from an optical surface, particularly from a dividing surface causes flare which may deteriorate quality of an image photographed. To cope with the above phenomenon, a light shielding member can be bonded to a periphery of lens having been cut after cutting lens. However, because the lens of the camera module used in the mobile phone and so forth are small in a diameter, it is difficult to bond the light shielding member to the periphery thereof, making manufacturing processes complicated. Also, conventionally, a diaphragm member to regulate a transmission area was installed as a separate member which was laborious.

Considering the above problems of the prior art, an object of the present invention is to provide the camera module manufacturing method and the camera module, which enhance performance of the camera module without the manufacturing method being complicated.

Means to Resolve the Problem

Item 1. A camera module manufacturing method, having steps of: preparing an image sensor wafer having a plurality of image sensor chips, wherein a photoelectric conversion element is disposed on one surface of each of the plurality of the image sensors and external connection terminals are disposed on an other surface of each of the plurality of image sensors; preparing a lens array formed by disposing a plurality of lenses corresponding to the plurality of image sensor chips; bonding the lens array to the one surface of the image sensor wafer on which photoelectric conversion elements are disposed; then, dividing the image sensor wafer into individual camera modules; and forming a light shielding layer on a side surface of each lens to be separated each other.

Item 2. A camera module manufacturing method, having steps of: preparing an image sensor wafer having a plurality of image sensor chips, wherein a photoelectric conversion element is disposed on one surface of each of the plurality of the image sensors and external connection terminals are disposed on another surface of each of the plurality of image sensors; preparing a lens array formed by disposing a plurality of lenses corresponding to the plurality of image sensor chips; bonding the lens array to the surface of an image sensor wafer on which photoelectric conversion elements are disposed; then, dividing the image sensor wafer into individual camera modules; and forming a light shielding layer on a side surface to be separated each other formed between each lens within a time period from start of cutting work to divide the image sensor wafer into the individual camera modules until bringing out individual camera modules.

Item 3. A camera module manufacturing method, having steps of: preparing an image sensor wafer having a plurality of image sensor chips, wherein a photoelectric conversion element is disposed on one surface of each of the plurality of the image sensors and external connection terminals are disposed on another surface of each of the plurality of image sensors; preparing a lens array formed by disposing a plurality of lenses corresponding to the plurality of image sensor chips; bonding the lens array to the surface of the image sensor wafer on which photoelectric conversion elements are disposed; then, dividing the image sensor wafer into individual camera modules; and forming a light shielding layer on a side surface of each lens by supplying a material to form the light shielding layer to a groove formed for dividing the image sensor wafer into the individual camera modules.

Item 4. A camera module manufacturing method, having steps of: preparing an image sensor wafer having a plurality of image sensor chips, wherein a photoelectric conversion element is disposed on one surface of each of the plurality of the image sensors and external connection terminal is disposed on an other surface of each of the plurality of image sensors; preparing a lens array formed by disposing a plurality of lenses corresponding to the plurality of image sensor chips; bonding the filter member to the lens array; further, bonding the lens array on the surface of the image sensor wafer to which photoelectric conversion elements are disposed; then, dividing the image sensor wafer into individual camera modules; and forming a light shielding layer on a side surface of each lens to be separated each other.

Item 5. A camera module manufacturing method, having steps of: preparing an image sensor wafer having a plurality of image sensor chips, wherein a photoelectric conversion element is disposed on one surface of each of the plurality of the image sensors and external connection terminals are disposed on another surface of each of the plurality of image sensors; preparing a filter member to interrupt incident light having a predetermined wave length; preparing a lens array formed by disposing a plurality of lenses corresponding to the plurality of image sensor chips; bonding the filter member to the lens array formed by disposing a plurality of lenses; further, bonding the lens array to the one surface of the image sensor wafer on which photoelectric conversion elements are disposed; then, dividing the image sensor wafer into individual camera modules; and forming a light shielding layer on a side surface to be separated each other formed between each lens within a time period from start of cutting work to divide the image sensor wafer into the individual camera modules until bringing out the individual camera modules.

Item 6. A camera module manufacturing method, having steps of: preparing an image sensor wafer having a plurality of image sensor chips, wherein a photoelectric conversion element is disposed on one surface of each of the plurality of the image sensors and external connection terminals are disposed on another surface of each of the plurality of image sensors; preparing a filter member to interrupt incident light having a predetermined wave length; preparing a lens array formed by disposing a plurality of lenses corresponding to the plurality of image sensor chips; bonding the filter member to the lens array; further, bonding the lens array to the one surface of the image sensor wafer on which photoelectric conversion elements are disposed; then, dividing the image sensor wafer into individual camera modules; and forming a light shielding layer on a side surface of each lens by supplying a material to form the light shielding layer to a groove formed for dividing the image sensor wafer into the individual camera modules.

Item 7. The camera module manufacturing method of any one of items 1 to 6, wherein the light shielding layer is formed with a resin film obtained by applying a resin to be hardened.

Item 8. The camera module manufacturing method of item 7, wherein the resin is hardened by radiating light.

Item 9. The camera module manufactured by the camera module manufacturing method of any one of items 1 to 8.

Item 10. A camera module manufactured by a camera module manufacturing method, having: bonding a lens array formed by disposing a plurality of lenses to one surface of an image sensor wafer on which photoelectric conversion elements are disposed, wherein a plurality of image sensor chips provided with external connection terminals on an other surface of the image sensor wafer are disposed, so that the plurality of the lenses are disposed to correspond to the plurality of the image sensor chips; and dividing the image sensor wafer into individual camera modules; wherein a light shielding layer is provided on a side surface of each of the plurality of the lenses.

Item 11. The camera module of item 10, wherein the side surfaces of the lenses are dividing surfaces formed between each lens within a time period from start of cutting work to divide the image sensor wafer into the individual camera modules until bringing out the individual camera modules.

The light shielding layer has only to be optically transmissive which can be a vapor-deposited film or can be formed by applying ink. As the light shielding layer forming method, for example, in case the light shielding film is formed before separating the camera modules, a product having the light shielding layer at a desired portion can be obtained by providing a groove including a surface of each camera module on which the light shielding film is formed and pouring ink which becomes transmissive after drying, and then drying the ink.

Contrarily, in case the light shielding film is formed after separating the camera modules, the light shielding film can be formed efficiently by pouring the ink into the cutting groove in a shape of matrix formed by a dicing saw, for example, on a tray (may called pallet) which is used for collectively bringing out the camera modules having been separated into individuals form the processing machine.

By forming a resin film on the cutting surface, the cutting surface is protected. Also, it has an effect of preventing a vicinity of the cutting surface from contamination due to littering of cutting chips. Cutting work includes forming of a portion of a part which will be cut afterward. Specifically, for example, the cutting work includes forming a cutting groove with a predetermined depth in a portion which will be cut afterwards before completely cutting to separate the lenses into individuals.

Order of bonding of the lens array and the image sensor wafer and start of cutting work does no matter, however termination of cutting work has to be after bonding. Bonding order, the number and allocation of the lens arrays, the filters and the image sensor wafers are not limited and various patterns can be considered. The aforesaid groove can be formed by laser work or by dividing using an expand tape, thus the processing method is not limited.

In case a width of the groove is narrow, ink can spread through the capillary action by itself, and an even film can be easily obtained. The light shielding film also can be formed by vapor deposition of a metal film or by applying ink with masking to protect an effective area of the lens and an electrode portion of the camera module.

Meanwhile, since presence of dirt or particles on the forming surface of the light shielding film will case defective ink application or defective coating, preprocesses such as cleaning of the application surface or applying flux are effective.

Effect of the Invention

According to the camera module manufacturing method of the present invention, a function for regulating the incident light flux transmission area and the function for suppressing the intrusion of stray light without using a separate diaphragm or a light shielding member as separate members. Thus it is possible to enhance the performance of the camera module without manufacturing process being complicated.

Also, according to the camera module related to the present invention, since the lens is not provided with the diaphragm or the shielding member as a separate member, a size in a direction perpendicular to the light axis and a direction of the light axis can be reduced while realizing light shielding in respect to the lens.

BRIEF DESCRIPTION OF THE DRAWINGS

FIG. 2 is a cross-sectional view showing a manufacturing process of a camera module.

Figure 1:
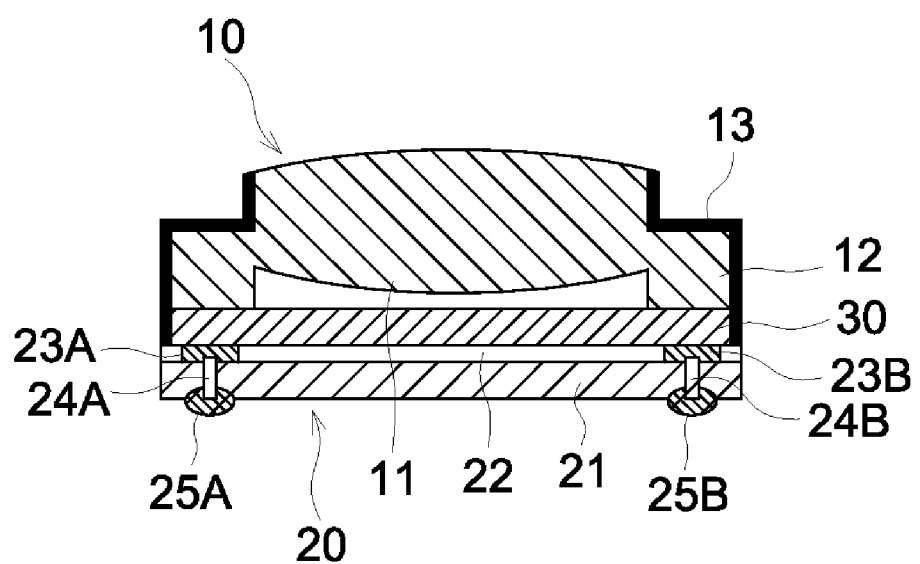
FIG. 1 is a cross-sectional view of a camera module manufactured by a manufacturing method related to an embodiment.

DESCRIPTION OF THE SYMBOLS 10 lens
11 lens main body
12 lens supporting frame
13 light shielding layer
20 image sensor chip
21 silicon chip
22 supporting glass substrate
23A, 23B electrode pad
24A, 24B re-wiring
25A, 25B bump electrode
30 IR filter
100 image sensor wafer
101 IR filter glass
102 lens array
200 camera module
ASY structural body
DB dicing saw
MR light shielding room
NZ nozzle
PL palette
PLa straight groove

DESCRIPTION OF THE PREFERRED EMBODIMENT

An embodiment of the present invention will be described with reference to the drawings. FIG. 1 is a cross sectional view of a camera module manufactured by a manufacturing method related to the present embodiment. The camera module is basically configured by bonding a filter 30 and a lens 10 onto the image sensor chip 20.

The lens 10 is configured with a lens body 11 in a shape of a circle as viewed from a light axis direction and a lens supporting frame 12 integrated with the lens body 11 to support the lens body 11. A light shielding layer 13 is formed from the side surface of the lens body 11 to a side surface of the lens supporting frame 12. The lens 10 is capable of being formed by, for example, injection mold, and a resin is a material thereof in the above case.

The lens supporting frame 12 is protruding outward in a direction perpendicular to the light axis from the lens boy 11 and is in a rectangular shape as view from the light axis direction. The bottom surface of the lens supporting frame is bonded to a position corresponding to a periphery section of a surface of the image sensor chip 20 via an IR filter 30.

Also, in the image sensor chip 20, a CCD representing the photoelectric conversion element is formed on a surface of the silicon chip 21 and a supporting glass substrate 22 is bonded thereon by an adhesive so as to support the silicon chip 21. Also at a periphery section of a surface of the silicone chip 21, electrode pads 23A and 23B are formed. The electrode pads 23A and 23B are connected with an input output circuitry of the image sensor chip 20.

To bottom surfaces of the electrode pads 23A and 23B, re-wirings 24A and 24B which penetrate the silicon chip 21 and reach to a rear surface of the image sensor chip 20 are connected, and bump electrodes 25A and 25B are formed on the re-wirings 24A and 24B protruding form the rear surface.

In the above configuration, by providing a filtering function for the supporting glass substrate 22 supporting the silicon chip 21, the IR filter 30 can be eliminated. Thus cost reduction is realized by reducing number of parts. In the above case, the filtering function can be obtained by applying vacuum vapor deposition of metal on the supporting glass substrate 22 or by mixing copper particles in the supporting glass substrate 22. Also, the filtering function can be obtained by depositing a filter member configured with multi lamella on a surface of the lens 10. The multi lamella is formed by vacuum vapor deposition of a material such as a metal having a specific transmission characteristic.

Figure 3A:
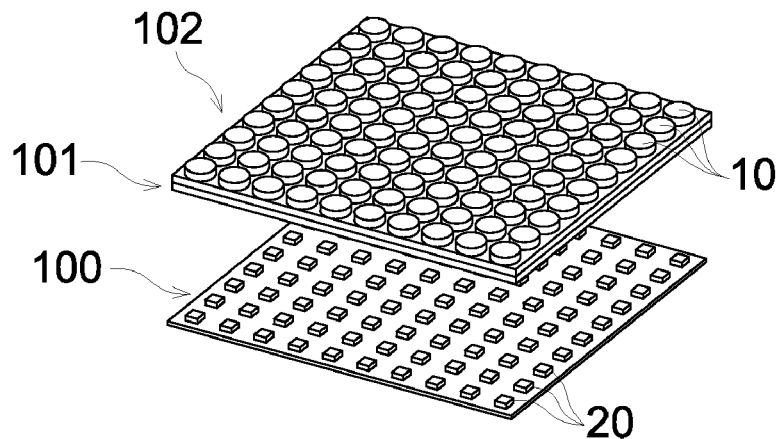
FIG. 3 is a perspective view showing a manufacturing process of a camera module.
Figure 3B:
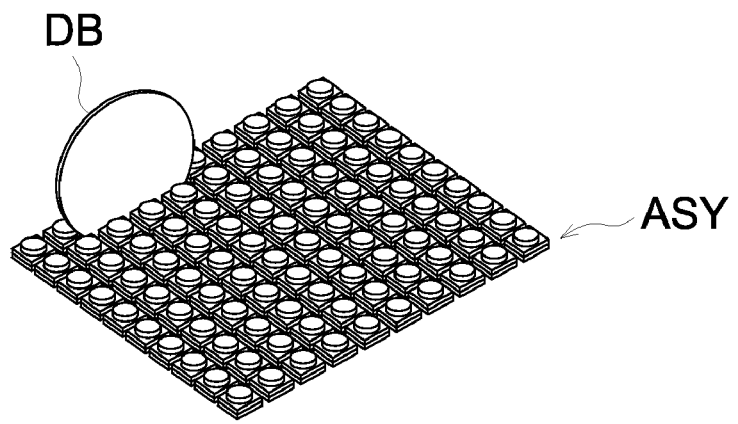
Figure 3C:
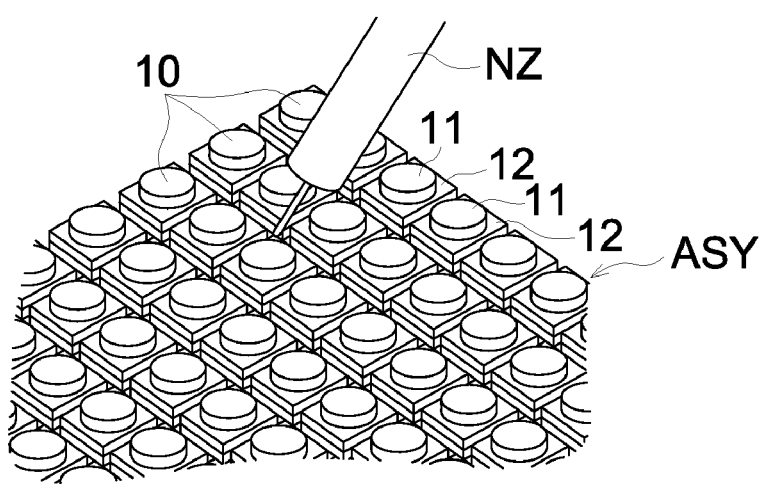

Next, a manufacturing method of a camera module having the above configuration will be described. FIG. 2 and FIG. 3 show manufacturing process of the camera model. First, an image sensor wafer 100 configured by disposing a plurality of image sensor chips 20 in a matrix, an IR filter glass (filter member) 101 in a shape of a wafer and a lens array 102 where a plurality of lenses 10 having a shape and a size to be adaptable to the image sensor chip 20 are arranged and integrated in a matrix corresponding to the image sensor chip 20 are prepared.

Next, an structural body ASY where the image sensor wafer 100, the IR filter glass 101 and the lens array 102 are integrated by bonding with an adhesive is obtained (refer to FIG. 2b). Namely, the structural ASY has a structure where the IR filter glass 101 is bonded on the image sensor wafer 100 then a lens array 102 is further bonded on a surface where the CCDs of the image sensor wafer 100 are disposed.

Further, a bottom surface of the structural body ASY is supported by a pallet PL so as to prevent damages due to collision between parts and jigs or among the parts during cutting work representing post-processing or during transportation (Refer to FIG. 2c). The pallet PL is formed of metal or ceramic and a silicon film is formed on the surface thereof. Also, the bottom surface of the structural body ASY is bonded onto the pallet PL in a detachable manner, thereby preventing the structural body ASY from slip.

On a surface of the pallet PL, straight grooves PLa are formed laterally and longitudinally so that the structural body ASY is disposed on the pallet PL in a way that the straight groove Pla positions under a boarder line of the image sensor chip 20.

Next, as FIGS. 2c and 2b show, camera modules are separated into individuals by cutting the structural body ASY along a boarder line of two adjacent image sensor chips 20 by a rotating dicing saw blade DB (or laser). When this occurs, the straight grooves PLa are formed on a surface of the pallet PL so as not to be interfered by the dicing saw blade DB and to capture cutting chips.

Further, as FIG. 2d and FIG. 2c show, the divided structural bodies ASY are brought into a light shielding room MR per the pallet PL. Then a nozzle NZ moves along the straight groove PLa so as to eject a light curing resin in a liquid state in black color towards the dividing surface (the groove formed by dividing) of the camera module from a front end of the nozzle NZ. When this occurs, while the ejected light curing resin adheres a side surface of the lens supporting frame 12, the resin can be applied on the side surface of the lens body 11 by moving the nozzle NZ. The straight groove PLa formed on the surface of the pallet PL is configured to absorb excess resin. Further, by turning on an unillustrated ultra violet light lamp, the adhered light curing resin is hardened and transformed into a light shielding layer in a shape of a film. Namely the light shielding layer is formed by a resin film obtained by hardening. Thereafter, the camera modules are brought out from the pallet PL individually. Whereby, the shielding layer is formed on the diving surface formed between each lens within the time period from beginning of cutting work to divide into the each camera module until dividing each camera module in to individuals and bring them out.

According to the present embodiment, by forming the light shielding layer on the side surface of each lens body 11 and on the side surface of each lens supporting frame 12, a diaphragm function to regulate the incident light flux transmitting area and a function to suppress intrusion of stray light without using a separate diaphragm or a light shielding member can be provided. Therefore, performance of the camera module can be improved without the manufacturing process being complicated.

Meanwhile, the structural body ASY can be fixed on the pallet PL by suction mechanism to suction air (suction ceases when ink is applied) or can be fixed by adhesive. In case the suction mechanism is disposed on the pallet PL, more than one micro suction hole are provided on the retaining surface for the structural body ASY in a way that one side of the suction hole is communicated with an air suction mechanism so as to suctions the bottom surface when the structural body is attached. Also, at a periphery of the structural body ASY, it is preferable to provide a wall and a pin on the pallet PL for positioning. Further, considering application of the resin, Teflon™ layer can be formed on the surface of the pallet for washability.

While the present invention has been described with reference to the embodiment, it is understand that the present invention is not limited to the above embodiments and changes and modifications without being departing from the spirit and scope of the inventions are possible.

What is claimed is:

1. A camera module manufacturing method, comprising steps of:
    preparing an image sensor wafer comprising a plurality of image sensor chips, wherein a photoelectric conversion element is disposed on one surface of each of the plurality of the image sensors and external connection terminals are disposed on another surface of each of the plurality of image sensors;
    preparing a lens array formed by disposing a plurality of lenses corresponding to the plurality of image sensor chips;
    bonding the lens array to the one surface of the image sensor wafer on which photoelectric conversion elements are disposed;
    fixing the image sensor wafer via the another surface of the image sensor wafer on a supporting member having grooves on a surface on which the image sensor wafer is fixed to correspond with dividing portions of the image sensor wafer;
    dividing the image sensor wafer into individual camera modules by forming grooves on the image sensor wafer;
    forming a light shielding layer on side surfaces of each lens to be separated from each other by supplying a non-transparent material in a liquid state to the grooves formed on the image sensor wafer; and
    bringing out the individual camera modules from the supporting member;
    wherein the grooves of the supporting member absorb an excessive non-transparent material in the liquid state.

2. A camera module manufacturing method of claim 1, wherein the light shielding layer is formed within a time period from start of cutting work to divide the image sensor wafer into the individual camera modules until bringing out individual camera modules.

3. A camera module manufacturing method of claim 1, further comprising steps of:
    preparing a filter member to interrupt incident light having a predetermined wave length; and
    bonding the filter member to the lens array.

4. The camera module manufacturing method of claim 1, wherein the light shielding layer is resin film obtained by hardening a resin in a liquid state.

5. The camera module manufacturing method of claim 4, wherein the resin is hardened by radiating light.

6. A camera module manufactured by a camera module manufacturing method of claim 1.

7. The camera module of claim 6, wherein the side surfaces of the lenses are dividing surfaces formed between each lens within a time period from start of cutting work to divide the image sensor wafer into the individual camera modules until bringing out the individual camera modules.

8. A lens manufacturing method, comprising steps of:
    forming a lens array by disposing a plurality of lenses;
    fixing the lens array on a supporting member having grooves on a surface on which the lens array is fixed to correspond with dividing portions of the lenses;
    dividing the lens array into individual lenses by forming grooves on an image sensor wafer;
    forming a light shielding layer on side surfaces of each lens to be separated from each other by supplying a non-transparent material in a liquid state to the grooves formed on the image sensor wafer; and
    bringing out the lens from the supporting member;
    wherein the grooves of the supporting member absorb an excessive non-transparent material in the liquid state.

9. A lens manufacturing method of claim 8, wherein the light shielding layer is formed within a time period from start of cutting work to divide the lens array into the individual lenses until bringing out individual lenses.

10. The lens manufacturing method of claim 8, wherein the light shielding layer is resin film obtained by hardening a resin in a liquid state.

11. The lens manufacturing method of claim 10, wherein the resin is hardened by radiating light.

12. A lens manufactured by the lens manufacturing method of claim 8.

* * * * *